(12) United States Patent
Kinoshita

(10) Patent No.: US 6,405,647 B2
(45) Date of Patent: *Jun. 18, 2002

(54) INTAGLIO PRINTING METHOD, INTAGLIO PRINTER AND TOUCH PANEL

(75) Inventor: Makoto Kinoshita, Tottori-ken (JP)

(73) Assignee: Ricoh Microelectronics Co., Ltd., Tottori (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/903,505

(22) Filed: Jul. 13, 2001

Related U.S. Application Data

(62) Division of application No. 09/028,198, filed on Feb. 23, 1998.

(30) Foreign Application Priority Data

Feb. 21, 1997 (JP) .............................................. 9-053949

(51) Int. Cl.⁷ ................................................. B41F 1/00
(52) U.S. Cl. ...................................... 101/163; 101/170
(58) Field of Search ................................ 101/153, 158, 101/163, 170, 401.1

(56) References Cited

U.S. PATENT DOCUMENTS

| | | | | |
|---|---|---|---|---|
| 3,675,572 A | * | 7/1972 | Gosnell et al. | 101/401.1 |
| 5,127,330 A | * | 7/1992 | Okazaki et al. | 101/450.1 |
| 6,109,175 A | | 8/2000 | Kinoshita | |
| 6,225,205 B1 | | 5/2001 | Kinoshita | |

FOREIGN PATENT DOCUMENTS

| | | | |
|---|---|---|---|
| JP | 9-318804 | * | 12/1997 |
| WO | 96/26466 | * | 8/1996 |

* cited by examiner

*Primary Examiner*—Ren Yan
(74) *Attorney, Agent, or Firm*—Oblon, Spivak, McClelland, Maier & Neustadt, P.C.

(57) ABSTRACT

An intaglio printing method for transferring a resin to a print receiving material, using an intaglio printing master having portions depressed in a printing shape below the surface of the printing master, includes the steps of: filling a resin paste comprising a resin in the depressed portions of the printing master, bringing the printing master, with the resin paste being filled in the depressed portions thereof, into close contact with the print receiving material, hardening the resin in the resin paste in the depressed portions of the printing master, and separating the printing master from the print receiving material so as to transfer the hardened resin in the depressed portions of the printing master to the print receiving material. An apparatus for carrying out this intaglio printing method is proposed. By use of the apparatus, for instance, an elastic and durable spacer free from fatigue destruction for a touch panel is can be prepared in a circulation process.

14 Claims, 2 Drawing Sheets

INTAGLIO PRINTING METHOD, INTAGLIO PRINTER AND TOUCH PANEL

This application is a division of Ser. No. 09/028,198, filed on Feb. 23, 1998.

BACKGROUND OF THE INVENTION FIELD

1. Field of the Invention

The present invention relates to an intaglio printing method, in particular, an intaglio printing method suitable for the formation of spacers for use in a touch panel, an intaglio printer for carrying out the intaglio printing method, and also a touch panel.

2. Discussion of Background

Currently employed touch panels are electrostatic touch panels, optical touch panels, and resistance-type touch panels. Of these touch panels, resistance-type touch panels are most in general use.

A resistance-type touch panel is constructed of a pair of transparent panels or sheets which face each other, provided with a transparent electrode layer such as an ITO layer on the facing side of each panel or sheet. Thus, the touch panel is composed of a pair of such transparent panels or sheets. However, when such a touch panel is used by superimposing the same on a liquid crystal display or a CRT display, a panel made of glass is usually used as the lower panel, and a panel made of a polycarbonate or PET film with a thickness of hundred several tens microns is usually used as the upper panel since it is usually necessary that the upper panel be flexible and be brought into close contact with the lower panel when the upper panel is depressed. The upper most surface of the upper panel made of such a polycarbonate film or a PET film with which is depressed with the fingers or pens is usually coated with a hard coat layer to impart durability to the upper panel.

Coating patterns of transparent electrodes such as ITO electrodes can be roughly classified into two types, a digital type and an analog type.

In the digital type transparent electrodes, long narrow transparent electrodes, divided in the shape of stripes, with the formation of slits therebetween, are formed crosswise on the upper and lower panels, so that when the upper panel is depressed and the transparent electrodes in the upper and lower panels are electrically connected, the connected point or position is detected as a positional data in a horizontal direction and a vertical direction. In the transparent electrodes of the above-mentioned digital type, the position can be identified by detecting the ON/OFF of the stripe-shaped, crosswise disposed transparent electrodes, so that the detection can be performed with high accuracy since no detection error is caused by variations in the value of the resistance of the transparent electrodes, which may be caused by non-uniform coating of the electrodes. However, it is necessary that the transparent electrodes be divided and insulated in the shape of stripes by the formation of a masking resist by photolithography and an etching treatment. Thus, the production cost of the thus divided electrodes is high. Furthermore, the resolution of the electrodes is limited by the degree of the division of the electrodes, so that the digital type transparent electrodes have the shortcoming that the digital type electrodes are not suitable for precise positional detection.

In contrast, in the analog type transparent electrodes, which are recently widely used, the electrodes are not divided, but are continuous in the entire surfaces on the panels. In the transparent electrodes of the analog type, electric current flows in one direction, for instance, in a horizontal direction, through the electrode on a first panel, while in the electrode on a second panel, electric current flows in a direction vertical to the current flow direction in the electrode of the first panel. The upper and lower transparent electrodes are electrically connected by an electroconductive pads at the upper and lower end portions or the left and right end portions of the two electrodes.

When one point of a touch panel comprising the above-mentioned analog type transparent electrodes is depressed, a resistance is determined in proportional to the distance between the depressed point and the position of the pad which may be at the upper or lower end portion, or at the left or right end portion of the electrode. Based on a calculation of the thus determined resistance, the coordinates of the position can be calculated. In comparison with the digital type transparent electrodes, the analog type transparent electrodes, for which slit-shaped division of the electrodes are unnecessary, are capable of detecting the position more precisely. However, in the analog type transparent electrodes, if non-uniformity of the thickness of the coating of the electrodes is large, the precision of the positional detection is significantly lowered, so that a highly accurate control technique is required, for instance, for the vacuum deposition of ITO for the fabrication of the analog type transparent electrodes.

If the coating thickness of the electrodes varies, the actually depressed position differs from the calculated position. Even if any of the electrodes includes one portion in which the coating thickness of the electrode is not uniform, the accuracy of the positional detection is lowered in all the positions in the direction of the flow of the current, so that if there is a plurality of portions in which the coating thickness of the electrode is not uniform, all of the errors in the course from the pad to the contact point accumulate, the accuracy of the positional detection is worsened.

Recently, a hybrid type touch panel has been proposed, in which the advantage of the digital type electrodes that the production thereof is easy, and the advantage of the analog type electrodes that highly precise positional detection can be carried out are combined. In the hybrid type touch panel, the touch panel is divided into relatively large sections with slits being formed therebetween like digital type transparent electrodes, and within each section, analog positional detection is carried out, so that while the high accuracy of the positional detection is maintained in each section, the accumulation of the errors caused by the non-uniformity of the resistance beyond the sections is avoided. By this hybrid type touch panel, the accuracy of the positional detection is significantly improved, but the hybrid type touch panel has the shortcoming that the production cost thereof is extremely high.

In pursuing high precision in the positional detection, the positional detection systems have been changed as mentioned above. One of the most important elements that have significant effects on the cost and the accuracy of the positional detection in such detection systems is a spacer.

The spacer in the touch panel has the function that when the touch panel is not depressed, a predetermined space is maintained between the upper and lower transparent electrodes to avoid unnecessary connection of the two electrodes, while when the touch panel is depressed, the connection of the two electrodes is easily allowed, but the connected area is limited to a proper area.

The touch panel is required to be transparent because in many cases, the touch panel is used on a liquid crystal display or a CRT display. As a matter of course, the spacer for use in the touch panel is also required to be transparent. Therefore, as the material for the space, transparent resins are usually used. Furthermore, in order to improve the security and precision of the detection, and to make the spacer invisible to the eyes, it is required to make the spacer as small as possible in size.

There are two methods for producing the spacer, a printing method and a photolithographic method.

In the printing method, round holes are made in a stainless plate by etching, or round holes are made in a nickel plate by electroforming. By use of the thus produced stainless plate or nickel plate with round holes as a printing mask, for instance, an ultraviolet-curing resin is printed on a panel serving as a print receiving material, whereby a spacer is produced. As the printing masks used in such a printing method, such an etching mask and an additive mask made by electroforming can be employed. Each mask has its own advantages and disadvantages.

The production cost of the above-mentioned etching mask is lower than that of the additive mask. However, as to the shape of the openings of the holes, the inside wall of the holes in the etching mask is rough and the holes are made by etching from the upper side as well as the lower side of the plate, so that a central portion of the through-hole is narrower than the opposite openings of the through-hole. The roughness of the inner wall and the narrowness of the central portion of each hole significantly hinder the passing of the resin that through the hole in the course of the printing process, so that it may occur that the holes are clogged with the resin because the resin stays in the holes, or when the printing mask is separated from the panel serving as a print receiving material, the resin is pulled by both the panel and the mask to become like a thread extended between the the panel and the mask.

When the resin does not easily pass through the holes, as a matter of course, it is difficult to perform printing, using such small holes, so that the etching mask is not suitable for the production of a precise touch panel. Such clogging of the holes with the resin causes defects in the spacer. The result is that if there is one defect in the spacer, the area which is not supported by the spacer increases 4 times, so that the sensitivity of the touch panel becomes significantly non-uniform. Furthermore, if the above-mentioned threading takes place, even if the touch panel is depressed, proper electric connection cannot be performed by the presence of a thread-shaped resin between the upper and lower panels, which also causes non-uniformity in the touching sensitivity of the touch panel.

Because of the above-mentioned problems of the etching mask, there is a tendency that the additive mask is used more than the etching mask for the printing of the spacer.

The additive mask, however, has the shortcoming called hole losing.

The additive mask is produced as follows: A dry film, which is a photoresist, is laminated on a substrate which is an electrode for electroforming, with the application of pressure thereto by a roll. A photo film having a pattern of the same holes as the holes to be formed is brought into close contact with the laminated dry film, exposed to light and developed, whereby a female die for electrolytic plating is formed. The substrate provided with the female die is immersed in an electrolytic plating liquid and a plating layer is caused to grow with shaking to prepare an additive mask with a predetermined thickness. In the case of extremely small holes for preparing a space for the touch panel, the diameter of the female die in the dry film is about several ten microns, and the dry film is often peeled away from the substrate when shaken in the electrolytic plating liquid, which causes the hole losing. This occurs so frequently that it is a big problem when producing the spacer.

It is also difficult to prepare holes in a uniform shape either by the etching mask or by the additive mask, so that the amount of the resin to be printed becomes varies. This makes the height of the spacer non-uniform and makes it difficult to prepare a high precision spacer.

In accordance with the degree of positional detection accuracy and the resolution, there are a touch panel for finger touch, having a relatively large detection area suitable for the depression with the finger, and a touch panel for pen touch, suitable for detecting small characters or icons, using a special pen. AS mentioned above, the spacers prepared by the above-mentioned printing methods are not suitable for detecting small characters or icons, and therefore are currently used in the touch panel for finger touch.

A further method for forming the spacer is a photolithographic method. In the photolithographic method, a photosensitive resin is directly coated on the surface of a transparent electrode provided on the lower panel, and a photo film having a pattern of the same shape as that of the spacer to be formed is superimposed on the coated photosensitive resin, exposed to light and developed, and the remaining photosensitive resin is used as the spacer as it is.

This method is capable of forming a much finer spacer in comparison with the above-mentioned printing method, and the spacer produced by this method is mainly used in portable computer terminals for pen touch. In this method, most of the photosensitive resin is removed as a waste material at the process of the development, so that the production cost including the cost of the material to be removed, and the cost for treating the material to be discarded, are high.

Furthermore, a problem that the spacer falls off the panel due to the insufficient adhesion of the spacer to the panel also takes place.

As the material for the spacer for such a touch panel, rigid plastics are often used. In such a case, the spacer tends to become a lens-shaped spacer due to the surface tension of the plastics. Therefore, load and stress are concentrated on a top portion and the spacer eventually is broken into small particles or powder due to the fatigue thereof. When this takes place, the plastics powder is scattered on the surface of the transparent electrode around the spacer, and works as an insulating, foreign material, and causes a problem that correct and proper positional detection becomes impossible when the touch panel is depressed. Furthermore, the height of the space changes due to the broken spacer, and input errors may also be caused.

SUMMARY OF THE INVENTION

It is therefore a first object of the present invention to provide an intaglio printing method suitable for the formation of a spacer with high printing precision for use in a touch panel at low cost, which has excellent reliability free of fatigue destruction and the problem of the falling off from the surface of a print receiving material such as the surface of a panel, and other conventional problems.

A second object of the present invention is to provide an intaglio printer which can carry out the above-mentioned intaglio printing method.

A third object of the present invention is to provide a touch panel of which spacer has high durability.

The first object of the present invention can be achieved by an intaglio printing method for transferring a resin to a print receiving material, using an intaglio printing master having portions depressed in a printing shape below the surface of the printing master, comprising the steps of:

filling a resin paste that can be hardened to a solid resin in the depressed portions of the printing master, bringing the printing master, with the resin paste being filled in the depressed portions thereof, into close contact with the print receiving material, hardening the resin paste to make the resin paste a hardened solid resin in the depressed portions of the printing master, and separating the printing master from the print receiving material so as to transfer the hardened solid resin in the depressed portions of the printing master to the print receiving material.

The first object of the present invention can also be achieved by an intaglio printing method for transferring a resin to a print receiving material, using an intaglio printing master having portions depressed in a printing shape below the surface of the printing master, comprising the steps of:

filling a photo-setting resin paste that can be cured to a photo-set resin in the depressed portions of the printing master, bringing the printing master, with the photo-setting resin paste being filled in the depressed portions thereof, into close contact with the print receiving material, curing the photo-setting resin paste to make the photo-set resin in the depressed portions of the printing master by being exposed to light, and separating the printing master from the print receiving material so as to transfer the cured photo-set resin in the depressed portions of the printing master to the print receiving material.

The first object of the present invention can also be achieved by an intaglio printing method for transferring a resin to a print receiving material, using an intaglio printing master having portions depressed in a printing shape below the surface of the printing master, the surface of the printing master except the depressed portions being coated with a light shielding layer, comprising the steps of:

filling a photo-setting resin paste that can be cured to a photo-set resin in the depressed portions of the printing master, bringing the printing master, with the photo-setting resin paste being filled in the depressed portions thereof, into close contact with the print receiving material, curing the photo-setting resin paste to make the photo-setting resin paste a photo-set resin in the depressed portions of the printing master by the back side of the printing master opposite to the side of the depressed portions being exposed to light, and separating the printing master from the print receiving material so as to transfer the cured photo-set resin in the depressed portions of the printing master to the print receiving material.

The second object of the present invention can be achieved by an intaglio printer capable of transferring a resin to a print receiving material, using an intaglio printing master having portions depressed in a printing shape below the surface of the printing master, comprising:

means for filling a resin paste that can be hardened to a solid in the depressed portions of the printing master, means for bringing the printing master, with the resin paste being filled in the depressed portions thereof, into close contact with the print receiving material, means for hardening the resin paste to make the resin paste a hardened solid resin in the depressed portions of the printing master, and means for separating the printing master from the print receiving material so as to transfer the hardened resin in the depressed portions of the printing master to the print receiving material.

The third object of the present invention can be achieved by a touch panel which comprises a spacer comprising an elastic material, preferably produced by any of the above-mentioned intaglio printing methods of the present invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
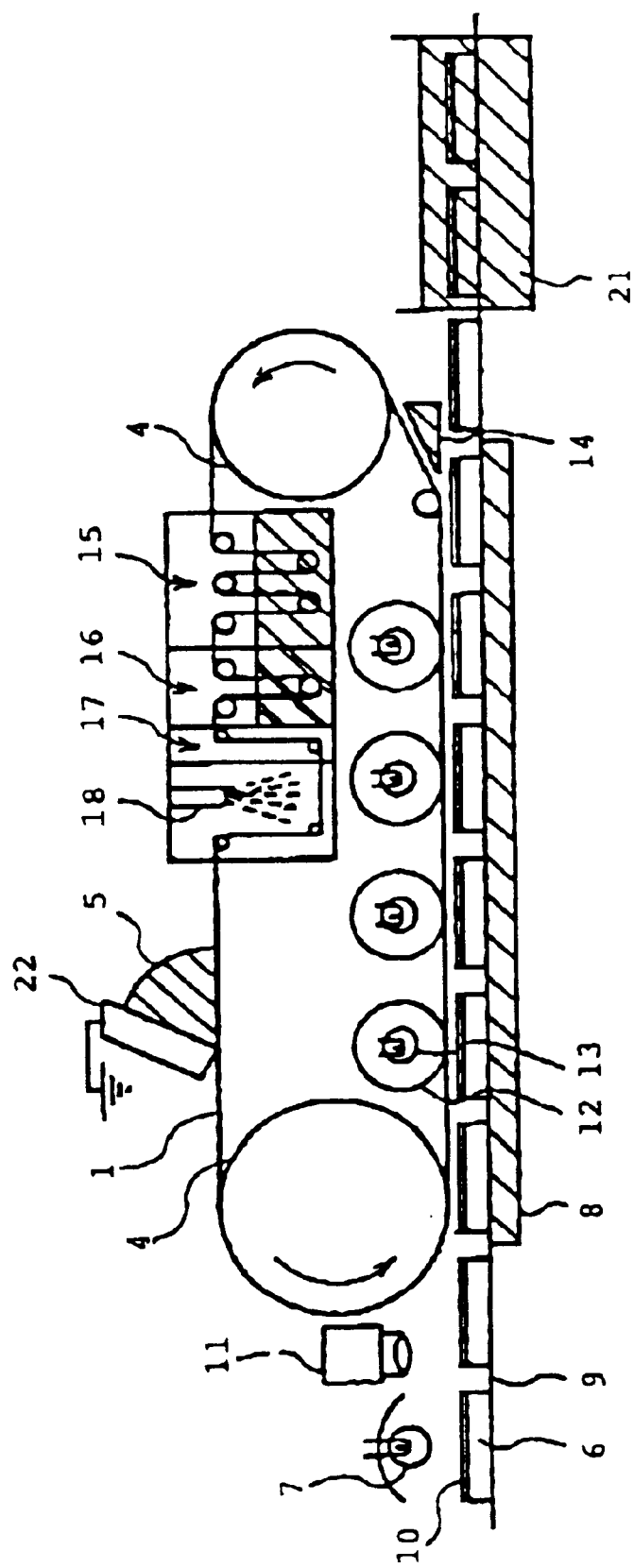
FIG. 1 is a schematic cross-sectional view of an apparatus for forming a spacer based on the intaglio printing method of the present invention.

The intaglio printing method of the present invention for transferring a resin to a print receiving material, using an intaglio printing master having portions depressed in a printing shape below the surface of the printing master, comprises the steps of:

filling a resin paste that can be hardened to a solid resin in the depressed portions of the printing master, bringing the printing master, with the resin paste being filled in the depressed portions thereof, into close contact with the print receiving material, hardening the resin paste to make the resin paste a hardened solid resin in the depressed portions of the printing master, and separating the printing master from the print receiving material so as to transfer the hardened solid resin in the depressed portions of the printing master to the print receiving material.

In the above intaglio printing method, a photo-setting resin paste that can be cured to a photo-set resin can be employed as the resin paste when a photo-setting resin paste is employed, it is preferable that after the printing master, with the photo-setting resin paste being filled in the depressed portions thereof, into close contact with the print receiving material, the photo-setting resin paste in the depressed portions of the printing master be cured by being exposed to light, and then the printing master be separated from the print receiving material so as to transfer the cured resin in the depressed portions of the printing master to the print receiving material.

In the above-mentioned intaglio printing method, it is preferable that an intaglio printing master having portions depressed in a printing shape below the surface of the printing master, with the surface thereof except the depressed portions being coated with a light shielding layer be employed, and that after the printing master, with the photo-setting resin paste being filled in the depressed portions thereof, into close contact with the print receiving material, the photo-setting resin paste in the depressed portions of the printing master be cured by the back side of the printing master opposite to the side of the depressed portion being exposed to light, and then the printing master be separated from the print receiving material so as to transfer the cured resin in the depressed portions of the printing master to the print receiving material.

As the material for the printing master for use in the above-mentioned intaglio printing method of the present invention, a plastic plate is preferable. It is particularly preferable that the depressed portions be formed in a printing shape, for instance, corresponding to the shape of a spacer for a touch panel, in the plastic plate by ablation working, using excimer laser or SR light in an ultraviolet region of synchrotron.

According to the above-mentioned intaglio printing method, in which the resin paste is filled in the depressed portions of the printing master, the printing master is brought into close contact with the print receiving material, the resin in the resin paste is hardened in the depressed portions of the printing master, and the printing master is separated from the print receiving material so as to transfer the hardened resin in the depressed portions of the printing master to the print receiving material, in particular, the printing master with the depressed portions formed by ablation working in a printing shape, for instance, corresponding to the shape of a spacer for a touch panel, for instance, a fine spacer for use in a touch panel, can be formed with high precision on a panel which serves as a print receiving material, with a small amount of the resin to be discarded and at low cost.

Furthermore, by separating the printing master from the print receiving material after hardening the resin paste filled in the depressed portions of the printing master, so as to transfer the hardened resin in the depressed portions of the printing master to the print receiving material, there can be formed a spacer with excellent reliability, free of the problem of falling off the panel, with firm affixing of the resin to the panel which serves as the print receiving material.

Further, by using a photo-setting resin paste as the resin paste, the photo-setting resin paste filled in the depressed portions can be easily hardened or cured by being exposed to light, so that the spacer can be easily formed by printing the resin on the panel serving as the print receiving material.

Further, according to the intaglio printing method, using the intaglio printing master having portions depressed in a printing shape below the surface of the printing master, with the surface thereof except the depressed portions being coated with a light shielding layer, in which after the printing master, with the photo-setting resin paste being filled in the depressed portions thereof, is brought into close contact with the print receiving material, the photo-setting resin paste in the depressed portions of the printing master is cured by the back side of the printing master opposite to the side of the depressed portion being exposed to light, and then the printing master is separated from the print receiving material so as to transfer the cured resin in the depressed portions of the printing master to the print receiving material, if the photo-setting resin paste remains on the surface of the printing master except the depressed portions when the photo-setting resin paste is filled in the depressed portions, or if the photo-setting resin paste spreads beyond the openings of the depressed portions when the print receiving material is brought into close contact with the printing master with the photo-setting resin paste filled in the depressed portions thereof, the photo-setting resin paste remaining on the surface of the printing master or the photo-setting resin paste spread beyond the openings of the depressed is not exposed to light by the presence of the light shielding layer provided on the surface of the printing master except the depressed portions thereof, so that only the photo-setting resin paste in the depressed portions can be hardened or cured.

Therefore, after the photo-setting resin is transferred to the print receiving material, an uncured photo-setting resin adhering to the surface of the print receiving material can be removed by washing, so that, for instance, a spacer can be formed with high precision on the print receiving material.

It is preferable that the intaglio printing master having the light shielding layer on the surface thereof except the depressed portions be prepared by subjecting a plastic plate to ablation working, with the provision of the light shielding mask layer having the openings corresponding to the openings of the depressed portions, as a conformal mask, on the plastic plate, thereby forming the depressed portions in the plastic plate.

In this method, the light shielding mask layer used for the formation of the depressed portions by ablation working can also be used as the light shielding layer for preventing the surface of the printing master except the depressed portions from being exposed to the light for curing the photo-setting resin paste filled in the depressed portions.

As the photo-setting resin for use in the present invention, an elastomeric ultraviolet-curing resin is particularly preferable, for instance, for forming the spacer in the touch panel, since when the elastomeric ultraviolet-curing resin is used as the photo-setting resin as the material for the spacer for the touch panel, unlike the case where rigid plastics are used, it does not take place that load and stress are concentrated on a top portion of the spacer and the spacer eventually is broken into small particles or powder due to the fatigue thereof. Accordingly, it does not take place that the powder of the resin is scattered on the surface of the transparent electrode around the spacer, and works as an insulating, foreign material, and causes a problem that correct and proper positional detection becomes impossible when the touch panel is depressed. Furthermore, since the height of the space does not change, input errors will not be caused.

In the intaglio printing method of the present invention, the intaglio printing master may be in the shape of an endless belt, so that the resin paste can be filled in the depressed portions and the hardened resin can be transferred from the depressed portions to the print receiving material repeatedly and the printing of the resin on the print receiving material can be efficiently performed and accordingly the spacer can be formed efficiently.

Furthermore, in the intaglio printing method of the present invention, when the printing master, with the photo-setting resin paste filled in the depressed portions of the printing mater, is brought into contact with the print receiving material, pressure may be applied to the printing master so as to accelerate the fixing of the resin paste to the print receiving material and to effectively prevent the fall off of the printed space from the print receiving material, thereby forming a highly reliable spacer.

The spacer fox use in the touch panel of the present invention comprises an elastic material, and can be prepared by any of the above-mentioned intaglio printing methods of the present invention, using as the resin paste a paste of an elastic polymeric compound.

The touch panel of the present invention is hardly broken because of the use of the elastic spacer, in comparison with the conventional touch panel in which a spacer made of a rigid plastic is used.

Other features of this invention will become apparent in the course of the following description of exemplary embodiments, which are given for illustration of the invention and are not intended to be limiting thereof.

FIG. 1 is a schematic cross-sectional view of an apparatus for forming a spacer based on the intaglio printing method of the present invention.

Figure 2:
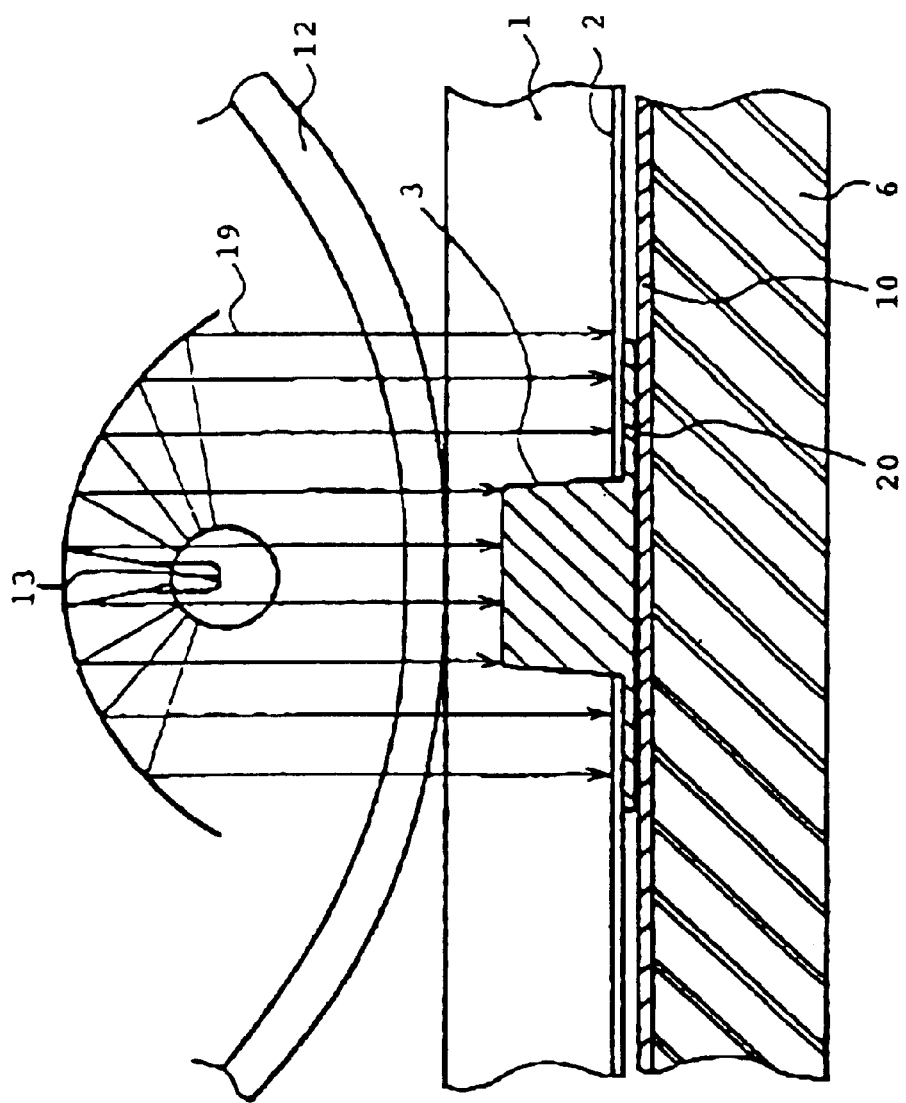
FIG. 2 is a schematic enlarged, partial cross-sectional view of the apparatus shown in FIG. 1, particularly in explanation of the exposure and curing steps in the transfer process therein.

FIG. 2 is a schematic enlarged, partial cross-sectional view of the apparatus shown in FIG. 1, particularly in explanation of the exposure and curing steps in the transfer process therein.

In FIG. 1, an intaglio printing master 1 is in the shape of an endless belt and is rotated in the direction of the arrows by a pair of drive apparatus 4 disposed on the left side and the right side of the intaglio printing master 1.

The top surface of the intaglio printing master 1 is coated with a thin film 2, such as a film of titanium oxide which is hard, opaque and abrasion resistant, and a depressed portion 3 for printing is formed in the intaglio print master 1 as shown in FIG. 2.

When the depressed portion 3 of the intaglio printing master 1 comes to the position of a squeegee 22 which is treated so as to be electroconductive in the course of the rotation of the intaglio printing master 1, the depressed portion 3 is filled with an elastomeric ultraviolet curing resin paste 5 with further rotation of the intaglio printing master 1, the depressed portion 3 proceeds toward a transfer process.

The elastomeric ultraviolet curing resin paste 5, which is filled in the depressed portion 3 of the intaglio printing master 1, is further brought into pressure contact with the surface of the glass plate 6, cured and fixed to the glass plate 6 by a roller 12 made of quartz glass (hereinafter referred to as the quartz glass roller 12) having excellent transparency with respect to ultraviolet light, and an ultraviolet lamp 13 for curing resin, which is built in a vacant portion of the quartz glass roller 12.

To be more specific, with reference to FIG. 2, the printing mask 1 is in close contact with the glass plate 6 with the ITO coating layer 10 up. In the depressed portion 3 of the intaglio printing master 1, directed to the side of the glass plate 6, there is filled the elastomeric ultraviolet curing resin paste 5 which is not yet cured. To the elastomeric ultraviolet curing resin paste 5, pressure is applied by the quartz glass roller 12 which applies pressure to the intaglio printing master 1, so that the adhesion of the ultraviolet curing resin paste 5 is accelerated.

The inside of the quartz glass roller 12 is radiated with ultraviolet light 19 emitted from the ultraviolet lamp 13. The ultraviolet light 19 passes through the transparent intaglio printing master 1 and cures the ultraviolet curing resin of the ultraviolet curing resin paste 5. However, the light shielding thin film 2 through which ultraviolet light does not pass is coated on the surface of the intaglio printing master 1 around the depressed portion 3, so that an ultraviolet curing resin 20 which spreads beyond the depressed portion 3 is not radiated with the ultraviolet light 19. Thus, the exposure is finished without the ultraviolet curing resin 20 which is not radiated with the ultraviolet light 19 being cured.

In a panel washing chamber 21, the uncured ultraviolet curing resin 20 can be easily removed and does not remain on the surface of the ITO coating 10, so that it does not occur that an unnecessary insulating layer is formed from such an ultraviolet curing resin remaining on the surface of the ITO coating 10, which may impair the function of the touch panel.

With further movement of the endless-belt-shaped intaglio printing master 1, the printing master 1 reaches a separation apparatus 14 at which the printing master 1 is separated from the surface of the glass plate 6, and the elastomeric ultraviolet curing resin 5 is transferred to the glass plate 6.

After the transfer of the elastomeric ultraviolet curing resin 5 from the printing master 1 to the glass plate 6, the printing master 1 is transported, passing over the drive apparatus 4, into an intaglio printing master belt cleaning apparatus 15, where the uncured resin and foreign materials such as glass pieces are removed from the surface of the printing master 1.

The printing master 1 is then rinsed with a rinsing agent in a rinse chamber 16 and dried in a drying chamber 17. The printing master 1 is then subjected to releasing property improvement treatment in a releasing agent application apparatus 18 and is returned to the resin paste filling process. Thus, the printing master 1 is circulated through the pretreatment process for the application of the release agent, the resin paste filling process using the squeegee, the transfer process of bringing the printing master 1 into close contact with the print receiving material, and the after-treatment process including the steps of washing and drying the printing master 1, whereby the printing master 1 is repeatedly use for repeated printing.

In the above-mentioned processes through which the printing master 1 is circulated, it is preferable that the range from the resin paste filling process through the transfer process be in an atmosphere of reduced pressure or in vacuum in order to prevent the formation of air bubbles in the resin paste or to prevent air from entering the depressed portions of the printing master 1 in the resin paste filling process, and in order to make it easy to separate the printing master 1 from the print receiving material in the transfer process, since in the atmospheric pressure, the separation of the printing master 1 from the to become difficult.

Furthermore, for destaticizing the materials employed in the above-mentioned processes, it is preferable that various antistatic steps be taken in the course of the above-mentioned processes, for instance, using an ionizer.

Japanese Patent Application No. 9-53949, filed Feb. 21, 1997, is hereby incorporated by reference.

What is claimed is:

1. An apparatus for forming spacers for a touch panel, comprising:

an intaglio printing master having a plurality of depressed portions in a shape of said spacers below a surface portion of said intaglio printing master and a light shielding layer provided on the surface portion of said intaglio printing master except said depressed portions thereof, said light shielding layer being configured to shield a light for curing a photo-setting resin paste to a photo-set resin;

means for filling said photo-setting resin paste into the depressed portions of said intaglio printing master;

means for bringing said intaglio printing master, with the depressed portions thereof being filled with said photo-setting resin paste, into close contact with a print receiving material;

means for curing said photo-setting resin paste into said photo set resin in the depressed portions of said intaglio printing master by exposing to light; and means for separating said intaglio printing master from said print receiving material so as to transfer said photo-set resin in the depressed portions of said intaglio printing master to said print receiving material.

2. The apparatus for forming spacers as claimed in claim 1, wherein said intaglio printing master comprises a plastic plate.

3. The apparatus for forming spacers as claimed in claim 2, wherein said depressed portions of said intaglio printing master are formed in said plastic plate by ablation working.

4. The apparatus for forming spacers as claimed in claim 2, wherein said depressed portions of said intaglio printing master are formed in said plastic plate by ablation working using a light shielding mask layer having at least one opening as a conformal mask.

5. The apparatus for forming spacers as claimed in claim 1, wherein said photo-setting resin paste comprises an elastomeric ultraviolet-curing resin.

6. The apparatus for forming spacers as claimed in claim 1, wherein said intaglio printing master is an endless-belt-shaped intaglio printing master, and the filling of said resin paste in said depressed portions and the transferring of said photo-set resin to said print receiving material are carried out repeatedly.

7. An apparatus for forming spacers for a touch panel, comprising:

an intaglio printing master having a plurality of depressed portions in a shape of said spacers below a surface portion of said intaglio printing master, said surface portion of said intaglio printing master except said depressed portions being coated with a light shielding layer;

means for filling a photo-setting resin paste capable of being cured to a photo-set resin into the depressed portions of said intaglio printng master;

means for bringing said intaglio printing master, with the depressed portions thereof being filled with said photo-setting resin paste, into close contact with a print receiving material;

means for curing said photo-setting resin into a photo-set resin in the depressed portions of said intaglio printing master by exposing a back side of said intaglio printing master opposite to a side of said depressed portions to light; and means for separating said intaglio printing master from said print receiving material so as to transfer said photo-set resin in the depressed portions of said intaglio printing master to said print receiving material.

8. The apparatus for forming spacers as claimed in claim 7, wherein said intaglio printing master comprises a plastic plate.

9. The apparatus for forming spacers as claimed in claim 8, wherein said depressed portions of said intaglio printing master are formed in said plastic plate by ablation working.

10. The apparatus for forming spacers as claimed in claim 8, wherein said depressed portions of said intaglio printing master are formed in said plastic plate by ablation working using a light shielding mask layer having at least one opening as conformal mask.

11. The apparatus for forming spacers as claimed in claim 10, wherein said light shielding mask layer comprises said light shielding layer.

12. The apparatus for forming spacers as claimed in claim 7, further comprising means for removing said photo-setting resin paste which is not cured from the surface portion of said print receiving material after transferring said photo-set resin to said print receiving material.

13. The apparatus for forming spacers as claimed in claim 7, wherein said photo-setting resin paste comprises an elastomeric ultraviolet-curing resin.

14. The apparatus for forming spacers as claimed in claim 7, wherein said intaglio printing master is an endless-belt-shaped intaglio printing master, and the filling of said resin paste in said depressed portions and the transferring of said cured photo-set resin to said print receiving material are carried out repeatedly.

* * * * *

UNITED STATES PATENT AND TRADEMARK OFFICE
CERTIFICATE OF CORRECTION

PATENT NO. : 6,405,647 B2
DATED : June 18, 2002
INVENTOR(S) : Makoto Kinoshita

It is certified that error appears in the above-identified patent and that said Letters Patent is hereby corrected as shown below:

Title page,
Item [57], ABSTRACT,
Line 18, delete "is".

Column 2,
Line 12, change "proportional" to -- proportion --.

Column 4,
Line 8, change "varies" to -- varied --.
Line 16, change "AS" to -- As --.

Column 8,
Line 15, change "ablation" to -- abrasion --.
Line 21, change "ablation" to -- abrasion --.
Line 53, change "mater" to -- master --.

Column 10,
Line 23, change "use" to -- used --.
Line 34, after "the" (second usage) add -- print receiving material --.

Signed and Sealed this

Fourth Day of March, 2003

JAMES E. ROGAN
*Director of the United States Patent and Trademark Office*